United States Patent [19]
Bhuva

[11] Patent Number: 4,758,994
[45] Date of Patent: Jul. 19, 1988

[54] ON CHIP VOLTAGE REGULATOR FOR COMMON COLLECTOR MATRIX PROGRAMMABLE MEMORY ARRAY

[75] Inventor: Rohit L. Bhuva, Plano, Tex.

[73] Assignee: Texas Instruments Incorporated, Dallas, Tex.

[21] Appl. No.: 820,286

[22] Filed: Jan. 17, 1986

[51] Int. Cl.$^4$ ............................................. G11C 17/00
[52] U.S. Cl. ............................... 365/226; 307/296 R; 365/206
[58] Field of Search ............... 365/206, 96, 103, 104, 365/226; 307/296 R

[56] References Cited

U.S. PATENT DOCUMENTS 4,409,677 10/1983 Takemae et al. .................. 365/206
4,441,167 4/1984 Principi .............................. 365/94

FOREIGN PATENT DOCUMENTS 2087183 5/1982 United Kingdom ............... 365/206

Primary Examiner—Joseph A. Popek
Attorney, Agent, or Firm—Thomas R. FitzGerald; Leo N. Heiting; Melvin Sharp

[57] ABSTRACT

A programmable memory includes a voltage regulator (32) which is disposed between the supply voltage and the matrix supply line (10) for programmable memory cells. Each of the memory cells is comprised of a transistor (12) and a series fusible link (16). By maintaining a constant voltage on the matrix supply line (10), transients on the supply pin of a memory chip cannot cause spurious changes in the logic state of the memory cell resulting from parasitic capacitance (28).

12 Claims, 1 Drawing Sheet

ON CHIP VOLTAGE REGULATOR FOR COMMON COLLECTOR MATRIX PROGRAMMABLE MEMORY ARRAY

TECHNICAL FIELD OF THE INVENTION

The present invention pertains in general to semiconductor memories and, more particularly, to programmable memories having a matrix of common collector memory cells.

BACKGROUND OF THE INVENTION

Conventional programmable memories utilize a matrix of common collector memory cells which provide a current path between a supply node to a bit line. Each of the cells is comprised of a bipolar transistor with the collector connected to the supply node and the emitter connected through a fuse to the bit line. The logic state of the memory cell is determined by the condition of the fuse, with one state being represented by an intact fuse and the other logic state being represented by an open fuse.

When a memory cell is selected, the bit line is connected to a sense amp which is essentially a current source. The sense amp determines if current is being drawn from the emitter of the memory cell attached to the bit line. This current is sensed and the voltage on a corresponding output pin changed to correspond to the sensed logic state of the selected memory cell.

During the transition between logic states of the sensed memory cell, it is necessary to change the voltage on the output pin. This output pin has a predetermined amount of distributed capacitance associated therewith. When a transition occurs, the capacitance on the output pin must either be discharged or charged by the output buffer circuitry. If the output pin undergoes a transition from a low voltage to a high voltage, the capacitance on the output must be charged to a high voltage. This requires a predetermined amount of current to be sourced from the output buffer circuitry to the output pin. In order to source this current, it is necessary for additional current to be drawn from the supply pin and through the various "runs" on the circuit in order to supply this current. In high speed devices, this charge time may be as little as two nanoseconds.

Transients on the supply line create problems that occur during charging up of the output pin when making a logic transition. In conventional devices, the collectors of the transistors utilized in the memory cell are all connected directly to the supply node. Therefore, when the supply voltage is pulled low, the collectors of the transistors and memory cells are also pulled low. When the circuit recovers, the collector voltages return to the supply voltage level. However, due to the parasitic capacitance between the collector of the transistors in the memory cells and the bit line, the bit line tends to be pulled high, thus resulting in the possibility of outputting a false logic state.

In view of the above disadvantages, it is desirable to isolate the memory cells from transients on the supply line that result from capacitive loading of the output pins.

SUMMARY OF THE INVENTION

The present invention disclosed and claimed herein comprises a memory matrix for a programmable memory. The matrix is comprised of common collector memory cells which are operable to be disposed between a matrix supply line and a bit line to supply current therebetween. The memory cells are fused such that a first logic state exists when the fuse is opened and a second logic state exists when the fuse is closed. The matrix supply line is isolated from the chip supply line such that voltage transients on the chip supply line are not reflected on the matrix supply line and, subsequently, on the bit line. In the preferred embodiment, the isolation circuit is a voltage regulator which provides a stable voltage lower than the supply voltage on the matrix supply line.

BRIEF DESCRIPTION OF THE DRAWINGS

For a more complete understanding of the present invention and the advantages thereof, reference is now made to the following description taken in conjunction with the accompanying Drawings in which.

DETAILED DESCRIPTION OF THE INVENTION

Figure 1:
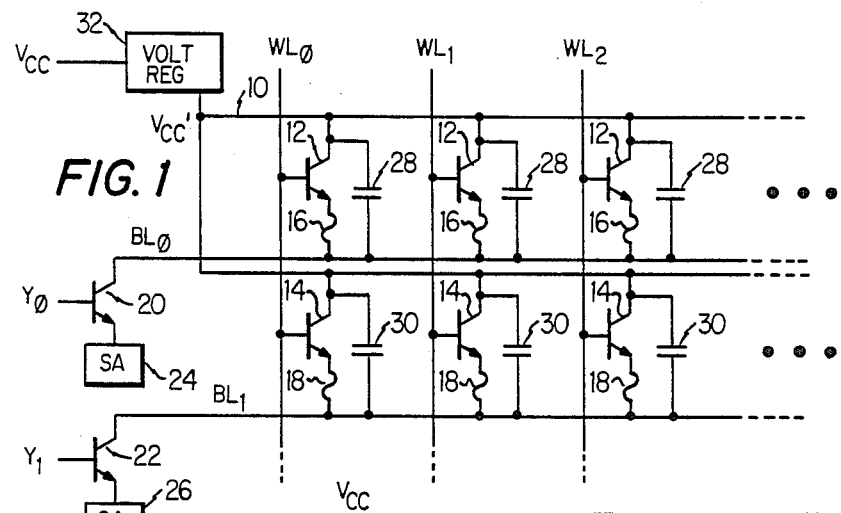
FIG. 1 illustrates a schematic diagram of a cell matrix for a programmable memory utilizing a regulated collector voltage for use in the memory cell.

Referring now to FIG. 1, there is illustrated a schematic diagram of the matrix of memory cells for a programmable memory. The programmable memory is of the type utilizing bipolar transistors with the collectors thereof connected to a common supply line 10 and the emitters thereof connected to respective bit lines through fuses. In this type of memory, the memory cells are operated under "static" conditions wherein the select memory cell connected to the supply line 10 during the sensing operation and output of the logic state.

In the schematic of FIG. 1, two bit lines $BL_0$ and $BL_1$ are illustrated with the memory cells connected to $BL_0$ comprised of NPN bipolar transistors 12 and the memory cells connected to bit line $BL_1$ comprised of NPN transistors 14. The transistors 12 have the collectors thereof connected to the supply line 10 and the emitters thereof connected to the bit line $BL_0$ through fusible links 16. Transistors 14 have the collectors thereof connected to the supply line 10 and the emitters thereof connected through the bit line $BL_1$ through fusible links 18. The fuses 16 and 18 are of conventional design for Programmable Read Only Memories (PROM) which are opened by increasing the current through the selected one of the memory cells to cause the respective fusible link to heat up and open. The bases of the transistors 12 and 14 are connected to respective word lines $WL_0$–$WL_1$.

Each of the bit lines $BL_0$ and $BL_1$ are connected through respective decode transistors 20 and 22, respectively, to sense amplifiers 24 and 26, respectively. The sense amplifiers 24 and 26 are comprised in part of current sources that source current from the respective bit line to determine if the fuse is open or closed. The particular bit line is selected by the Y-decode signal $Y_0$–$Y_N$.

Each of the transistors 12 that is interfaced with bit line $BL_0$ has a parasitic capacitance 28 associated therewith. The parasitic capacitance 28 is connected from the collector of the transistors 12 to the bit line $BL_0$. In a similar manner, a parasitic capacitance 30 is associated with each of the transistors 14 and connected between the collector of transistors 14 and the bit line BL$_1$. The parasitic capacitance represented by capacitors 28 and 30 is primarily due to circuit geometries for the transistors, supply line 10 and surrounding structures. In a similar manner, the supply line 10 is a distributed structure that is comprised of series resistance, series inductance and shunt capacitance.

In operation, when current is pulled from an external supply line with respect to the overall memory chip to charge the capacitance on the respective output terminal, the supply voltage V$_{CC}$ decreases and then increases. This is the result of the distributed inductance and capacitance between the device itself and the actual source of the supply voltage. This results in a switching transient on the supply line. In conventional devices, this switching transient is reflected on the supply line 10 to each of the memory cells. When the voltage decreases, current is pulled from the supply line 10 through the respective memory cell to ground through the respective one of the sense amps 24 or 26. However, when the voltage increases again, the parasitic capacitance represented by capacitors 28 and 30 causes the voltage on the respective bit line to increase until the capacitor has time to charge back up to the appropriate voltage level. This transient can cause a change in the current supplied to the sense amp, thus resulting in a false reading on the output pin.

In order to prevent switching transients on the supply line from affecting the current supplied through the respective one of the transistors 12 or 14 to the respective sense amp 24 or 26, a voltage regulator 32 is provided which is disposed between the supply voltage V$_{CC}$ and the voltage on supply line 10, this voltage level represented by V$_{CC}'$. Any switching transients on the supply voltage V$_{CC}$ are not reflected on the supply line 10. The only transients existing on the supply line 10 are those resulting from the actual increase of current through one of the memory cells when going from a logic low to a logic high state or from a logic high to a logic low state. Therefore, the voltage regulator 32 effectively prevents any switching transients on the supply voltage V$_{CC}$ resulting either from switching of logic states on the output of the device or from other sources external to the memory from causing variations in the voltage V$_{CC}'$ on supply line 10.

Although a common collector memory cell matrix has been illustrated in the preferred embodiment, it should be understood that any type of static memory cell can utilize the isolations provided by the voltage regulator of the present invention. The voltage regulator is useful with memory cells that are electrically interconnected with the supply line during sensing. This electrical interconnection allows voltage transients to be placed on the memory cell itself and possibly cause erroneous output levels.

Figure 2:
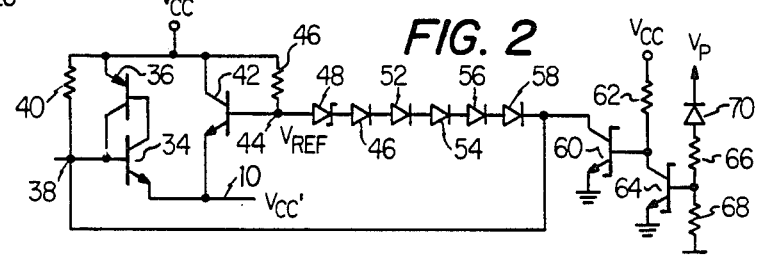
FIG. 2 illustrates a schematic diagram of the voltage regulator.

Referring now to FIG. 2, there is illustrated a schematic diagram of the voltage regulator 32 of FIG. 1. An NPN transistor 34 has the collector thereof connected to the base of a PNP transistor 36, the emitter thereof connected to the supply line 10 to provide the voltage V$_{CC}'$ and the base thereof connected to a node 38. The transistor 36 has the emitter thereof connected to V$_{CC}$ and the collector thereof connected to the node 38. A resistor 40 is connected between the node 38 and supply voltage V$_{CC}$. An NPN transistor 42 has the collector thereof connected to V$_{CC}'$ the emitter thereof connected to the supply line 10 and the base thereof connected to a node 44 with a voltage V$_{ref}$ applied thereto. The transistor 42 operates to provide a voltage regulation function with the transistors 34 and 36 operable to provide an overide function on the voltage regulator to increase the voltage during programming.

The voltage V$_{ref}$ is formed by a resistor 46 being disposed between the node 44 and V$_{CC}$ and five series connected diodes 48–56 and a series connected Schottky diode 58 connected to ground through a Schottky transistor 60. The diode drops across the diodes 48–58 provide a temperature compensated voltage drop to the transistor 60. The transistor 60 is maintained on by a resistor 62 connected between the base thereof and V$_{CC}$. In operation, transistor 60 is maintained on such that the cathode of diode 58 is held at ground and the base of transistor 34 is also held at ground. Therefore, the voltage reference V$_{ref}$ is formed by providing a current path through resistor 46 through diodes 48–58 to ground. The voltage V$_{CC}'$ is one diode drop below the voltage V$_{ref}$. The transistor 34 is maintained off and the base thereof connected to ground.

During programming, it is necessary to put a higher voltage on the supply line 10. To provide this, the transistor 60 is turned off by pulling the voltage on the base of transistor 60 to ground through a transistor 64. The transistor 64 has the base thereof connected between two series connected resistors 66 and 68 with the transistor 68 connected to ground and the transistor 66 connected through a zener diode 70 to a programming voltage V$_p$. The zener diode breaks down at the voltage V$_p$ to turn on transistor 64 and turn off transistor 60. This causes resistor 46 to completely turn on transistor 42 and resistor 40 turns on transistor 34. This provides a higher voltage on supply line 10 for programming purposes.

Figure 3:
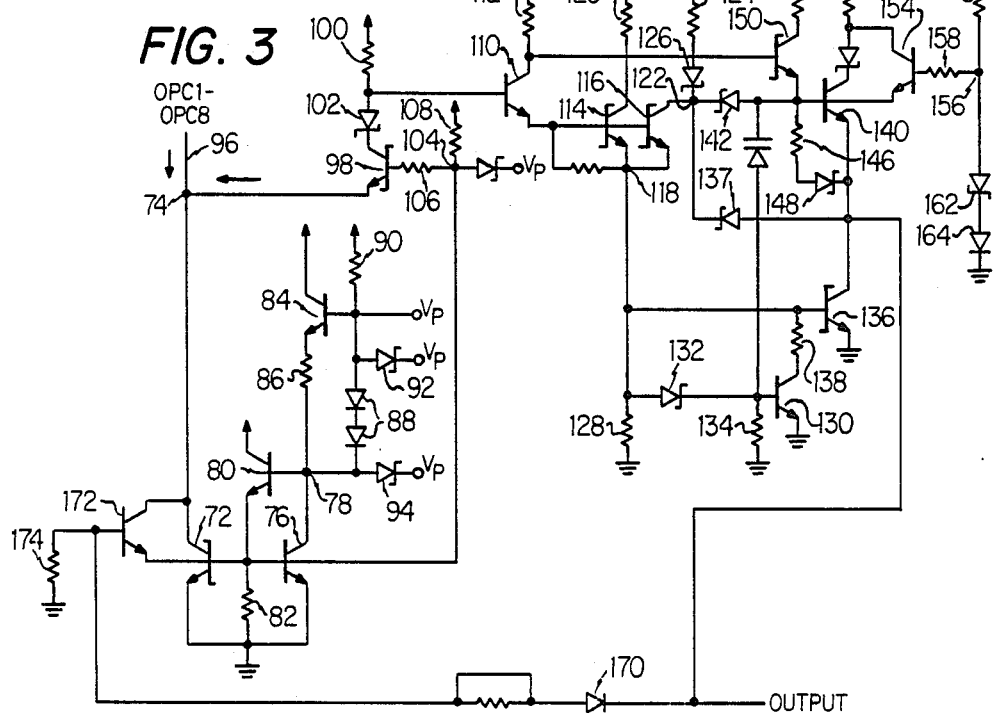
FIG. 3 illustrates a schematic diagram of the sense amplifier.

Referring now to FIG. 3, there is illustrated a schematic diagram of the sense amp represented by blocks 24 and 26 in FIG. 1. The sense amp is comprised of a current mirror which is comprised of a Schottky NPN transistor 72 with the emitter thereof connected to ground and the collector thereof connected to a node 74. The node 74 comprises the input to the sense amp from one of the Y-decode transistors 20 or 22 of FIG. 1. The other side of the current mirror is comprised of an NPN transistor 76 with the emitter connected to ground and the collector connected to a node 78. An NPN transistor 80 has the base thereof connected to the node 78, the emitter thereof connected to the basis of transistors 72 and 76 and a collector thereof connected to V$_{CC}$.

The bases of transistors 72 and 76 are connected to ground through a resistor 82. A transistor 84 has the emitter thereof connected to the node 78 through a resistor 86 and the collector thereof connected to V$_{CC}$. The base of transistor 84 is connected to node 78 through two series connected diodes 88 and also to V$_{CC}$ through a resistor 90. For programming purposes, the base of transistor 84 is connected to a signal "P" through a Schottky diode 92 and the node 78 is also connected to the signal "P" through a Schottky diode 94. The current mirror in the nonprogramming mode is operable to sinc current from the node 74. The node 74 is connected to the Y decode transistors 20 and 22 through a line 96 and also to an NPN Schottky transistor 98 at the emitter thereof with transistor 98 configured as an emitter follower with the collector thereof connected to $V_{CC}$ through a series connected resistor 100 and Schottky diode 102.

The base of the transistor 98 is connected to a node 104 through a series resistor 106 with the node 104 being connected to $V_{CC}$ through a resistor 108. The junction of resistor 100 and diode 102 is connected to the base of a Schottky NPN transistor 110 which has the collector thereof connected to $V_{CC}$ through a resistor 112 and the emitter thereof connected to the bases of Schottky transistors 114 and 116. The emitter of Schottky transistor 114 is connected to a node 118 with the collector thereof connected to $V_{CC}$ through resistor 120. Transistor 116 has the collector thereof connected to a node 122 and the emitter thereof connected to node 118. Node 122 is connected to $V_{cc}$ through a series connected resistor 124 and Schottky diode 126. Node 118 is connected to ground through a resistor 128 and also to the base of a Schottky transistor 130 through a Schottky diode 132.

The base of transistor 130 is connected to ground through a resistor 134 and the collector thereof is connected to the base of a Schottky transistor 136 through a series resistor 138. Transistor 136 has the base thereof connected to node 118 and the collector thereof connected to the emitter of a transistor 140, the base of transistor 140 being connected to node 122 through a Schottky diode 142. Transistor 136 also has the collector thereof connected to the output pin and to the node 122 through a diode 137. Transistor 140 has the emitter thereof connected to the base thereof through a series connected resistor 146 and Schottky diode 148. The base of transistor 140 is also connected to the emitter of a Schottky transistor 150, the base of which is connected to the collector of transistor 114 and the collector of which is connected to $V_{CC}$ through a resistor 152. Transistor 140 is connected to the collector of a transistor 154 through a Schottky junction and the base of transistor 140 is connected to the emitter of transistor 154. The transistor 154 has the base thereof connected to a node 156 through resistor 158, node 156 connected to $V_{CC}$ through a resistor 160 and to ground through a series connected Schottky diode 162 and a diode 164.

In operation, current is caused to flow through emitter follower transistor 98 to node 74 when the voltage on node 74 is lowered as a result of current not flowing through line 96. As current flows through transistor 98, the voltage drop across resistor 100 increases and turns off transistor 110 which in turn turns off transistors 114 and 116. When transistors 114 and 116 turn off, transistor 136 also turns off and the output terminal goes high. Alternatively, when no current is being drawn through the emitter follower of transistor 98, resistor 100 pulls the base of transistor 110 high, turning on transistors 114 and 116. This in turn increases the voltage on the base of transistor 136, thus turning transistor 136 on and placing a low voltage on the output terminal. Therefore, the sense amplifier provides the function of sensing current through the memory cell.

When the current is flowing through the memory cell, a first state is present. When current does not flow through the memory cell to the sense amp, a second logic state is present. However, it should be understood that the transient that is removed from the supply line 10 by the voltage regulator 32 is that resulting from current supplied to the output terminal from the collector of transistor 136. This current is supplied by transistor 140 through a resistor 166 which is connected between the collector of transistor 140 to $V_{CC}$. This current can be quite high for a short duration of time, which in the preferred embodiment can be as high as twenty milliamps/nanoseconds/output. The current surge upon initial charging of the output terminal causes the supply voltage to momentarily decrease and then to increase. The voltage regulator 32 removes this transient from the supply line 10, thus preventing any transient response on the supply line 10 to each of the memory cells.

The sense amplifier also has the capability to increase the current through the current mirror portion by placing an external voltage on the output terminal during programming. A diode 170 is provided which is connected to the base of a transistor 172. Transistor 172 has the base thereof connected to ground through a resistor 174, the emitter thereof connected to the base of transistors 72 and 76 and the collector thereof connected to the collector of transistor 72. When the output terminal is connected to a voltage higher than the breakdown voltage of the zenor diode 170, turning on transistor 172. This effectively increases the current through the current source portion of the sense amp, thus increasing the current through the memory element.

In summary, there has been provided a voltage regulator for being connected between the supply voltage and the supply line for memory cells in a static programmable memory utilizing fusible links. The voltage regulator maintains the supply line to each of the memory cells at a constant voltage, thus preventing any voltage swings due to various transients on the supply line from changing the state of the output. A sense amplifier is provided for sensing current flowing through the memory cell to ground to determine the logic state thereof.

Although the preferred embodiment has been described in detail, it should be understood that various changes, substitutions and alterations can be made therein without departing from the spirit and scope of the invention as defined by the appended claims.

What is claimed is:

1. A programmable memory matrix on a programmable memory chip which is immune to voltage transients appearing on a chip supply line, comprising:
    a matrix of static memory cells arranged in rows and columns;
    a matrix voltage supply line connected to each of said memory cells;
    a plurality of bit lines, each associated with a column of said memory cells with each of said memory cells having an output connected to the associated one of said bit lines;
    a plurality of word lines, each associated with a row of said memory cells for selectively activating the associated row of said memory cells for connection of the output thereof to said associated bit line; and
    isolation means connected between the chip supply line and said matrix supply line for providing a constant voltage on said matrix supply line independent of voltage transients on the chip supply line.

2. The memory matrix of claim 1 wherein said isolation means comprises a voltage regulator for regulating the voltage on said matrix supply line at a voltage lower than the voltage on the chip supply line.

3. The memory matrix of claim 1 wherein the selected one of said memory cells provides a current path from said matrix supply line to the associated one of said bit lines for a first logic state and provides no current path for a second logic state in a binary system.

4. The memory matrix of claim 3 wherein said memory cell is comprised of a bipolar transistor having a collector to emitter path and a fusible link disposed in series with said collector emitter path, such that current flows from said chip supply line to the associated one of said bit lines through said transistor and said fusible link, said transistor having the base thereof connected to the associated one of said word lines for activation thereof, the logic state of said memory cell being a function of said fusible link being opened or closed.

5. The memory matrix of claim 3 and further comprising;
   sense means for sinking current from each of said bit lines and sensing the current output from said bit line; and
   output means controlled by said sense amp means to output a first voltage when current is being output from said bit line to said sense means and outputting a second voltage when current is not being output by said bit line to said sense means.

6. The memory matrix of claim 1 and further comprising sense means connected to each of said bit lines for sensing the logic state of the associated one of said memory cells connected to said bit lines by the associated one of said word lines.

7. A transient immune programmable memory matrix in a programmable memory chip, comprising:
   a chip supply line for supplying voltage to the chip;
   a matrix supply line;
   isolation means disposed between said chip supply line and said matrix supply line for supplying a constant voltage to said matrix supply line lower than the voltage on said supply line, said isolation means isolating said matrix supply line from voltage transients on said chip supply line;
   a matrix of common collector memory cells arranged in rows and columns and connected on one side to said matrix supply line and each having a series fuse for determining the logic state of the associated one of said memory cells, a first logic state existing when said associated fuse is closed and a second logic state existing when said associated fuse is opened;
   a plurality of bit lines, each associated with a column of said memory cells with each of said memory cells providing a current path between said matrix supply line and the associated one of said bit lines;
   a plurality of word lines, each associated with a row of said memory cells for selectively activating the associated row of said memory cells for connection to said associated bit lines; and
   means for selectively connecting each of said bit lines to an external current sink such that selection of one of said memory cells causes current to flow from said matrix supply line through said selected memory cell to said bit line and to the external current sink.

8. The memory matrix of claim 7 wherein said isolation means comprises a voltage regulator.

9. The memory matrix of claim 7 wherein the external current sink comprises a sense amp for sensing current and outputting a firt voltage when current flows from said matrix supply line through said selected memory cell and for outputting a second voltage when said selected memory cell is in the second logic state.

10. The memory matrix of claim 7 wherein each of said memory cells is comprised of an NPN transistor having an emitter-collector path with the collector thereof connected to said matrix supply line and the emitter thereof in series connection with said associated fuse with the base of said transistor connected to the associated one of said word lines.

11. The memory matrix of claim 1, wherein said isolation means comprises a resistor connected at one end to the chip supply line and diode means connected between the other end of the resistor and a common reference potential, said resistor and said diode means for generating a constant reference potential at the junction of the resistor and the diode means and for simultaneously switching transient current through said diode means to said common reference potential, to thereby isolate the constant reference potential from transient currents.

12. The memory matrix of claim 11 comprising a plurality of diodes serially connected between said resistor and said common reference potential.

* * * * *